United States Patent
Cao et al.

(10) Patent No.: US 11,417,814 B2
(45) Date of Patent: *Aug. 16, 2022

(54) LIGHT-EMITTING DIODE MODULE AND A LIGHT APPARATUS

(71) Applicant: XIAMEN ECO LIGHTING CO. LTD., Xiamen (CN)

(72) Inventors: Liangliang Cao, Xiamen (CN); Huiwu Chen, Xiamen (CN); Qiyuan Wang, Xiamen (CN)

(73) Assignee: XIAMEN ECO LIGHTING CO. LTD., Xiamen (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/236,912

(22) Filed: Apr. 21, 2021

(65) Prior Publication Data

US 2021/0242386 A1 Aug. 5, 2021

Related U.S. Application Data

(63) Continuation of application No. 16/291,773, filed on Mar. 4, 2019, now Pat. No. 11,011,690, which is a
(Continued)

(30) Foreign Application Priority Data

Jun. 2, 2017 (CN) .......................... 201710406156.3

(51) Int. Cl.
*H01L 33/64* (2010.01)
*H01L 25/075* (2006.01)
(Continued)

(52) U.S. Cl.
CPC ............ *H01L 33/647* (2013.01); *F21K 9/232* (2016.08); *F21K 9/238* (2016.08); *F21V 3/02* (2013.01); *F21V 29/70* (2015.01); *H01L 25/0753* (2013.01); *H01L 33/483* (2013.01); *H01L 33/502* (2013.01); *H01L 33/62* (2013.01); *F21Y 2103/33* (2016.08); *F21Y 2115/10* (2016.08); *H01L 2224/48137* (2013.01);
(Continued)

(58) Field of Classification Search
CPC ..................................................... H01L 33/647
See application file for complete search history.

(56) References Cited

U.S. PATENT DOCUMENTS 10,147,857 B2 * 12/2018 Lee .................. H01L 33/502
10,359,153 B2 * 7/2019 Kim .................. H05K 1/189

* cited by examiner

*Primary Examiner* — Vip Patel
(74) *Attorney, Agent, or Firm* — Chun-Ming Shih; Lanway IPR Services

(57) ABSTRACT

An LED chip module includes a first electrode plate and a second electrode plate. A first set of LED chip and a second set of LED chip are respectively set on the first electrode plate and the second electrode plate. The second set of LED chip is electrically connected to the first set of LED chip. A plastic shell is fixedly connected to the first electrode plate and the second electrode plate by injection molding to make the first electrode plate and the second electrode plate keep a predetermined space between each other and make a lower surface of the first electrode plate and a lower surface of the second electrode plate be respectively connected to two different polarity terminals of the power supply to drive the first set of LED chip and the second set of LED chip to emit light.

12 Claims, 13 Drawing Sheets

Related U.S. Application Data continuation of application No. 15/980,715, filed on May 15, 2018, now Pat. No. 10,270,022, which is a continuation of application No. 15/635,200, filed on Jun. 28, 2017, now Pat. No. 9,997,690.

(51) Int. Cl.
  *H01L 33/62* (2010.01)
  *H01L 33/48* (2010.01)
  *H01L 33/50* (2010.01)
  *F21K 9/232* (2016.01)
  *F21K 9/238* (2016.01)
  *F21V 3/02* (2006.01)
  *F21V 29/70* (2015.01)
  *F21Y 115/10* (2016.01)
  *F21Y 103/33* (2016.01)

(52) U.S. Cl.
  CPC ............... *H01L 2224/48247* (2013.01); *H01L 2224/48257* (2013.01); *H01L 2224/73265* (2013.01)

LIGHT-EMITTING DIODE MODULE AND A LIGHT APPARATUS

RELATED APPLICATION

The present application is a continuation application of U.S. patent application Ser. No. 16/291,773, which is a continued application of U.S. application Ser. No. 15/980,715.

TECHNICAL FIELD

The present invention relates to an LED (Light-Emitting Diode) module and a light apparatus, and in particular to the LED module and the light apparatus with a good heat dissipation effect.

BACKGROUND OF INVENTION

Technology of an LED flourished in these years makes lighting industry have big changes in these years. Many R & D people continue to focus on a variety of angles in the development of how to make LED more efficient configuration to produce a product with more light efficiency and higher stability.

Rise of heat dissipation and light efficiency has always been a goal of R & D personnel efforts, which depends on developing and providing the corresponding technical solutions to the LED chip which has not yet found the blind spot.

SUMMARY OF THE INVENTION

According to a first embodiment of a present invention, the first embodiment provides an LED chip module comprising a first electrode plate and a second electrode plate. A first set of LED chip is set on the upper surface of the first electrode plate, and a second set of LED chip is set on the upper surface of the second electrode plate. The second set of LED chip is electrically connected to the first set of LED chip. The first electrode plate and the second electrode plate may be patterned with a thin copper plate and then achieve a predetermined shape of multiple first electrode plates and the second electrode plates by etching the partial regions.

The thin plate with the first electrode plate and the second electrode plate may be placed in an injection molding machine to inject the plastic shell with a predetermined mold. The plastic shell is fixedly connected to the first electrode plate and the second electrode plate by injection molding. The injection molded plastic, the first electrode plate and the second electrode plate have a fixed adhesion so that the first electrode plate and the second electrode plate keep a predetermined space between each other. The plastic shell has an opening upward, downwardly making a lower surface of the first electrode plate and a lower surface of the second electrode plate are exposed so as to be respectively connected to two different polarity terminals of the power supply. A driving current after conversion of a battery or indoor power source for driving the first set of LED chip and the second set of LED chip to emit light.

The plastic shell has a groove upward and is filled with a fluorescent coating. The fluorescent coating covers the first set of LED chip and the second set of LED chip. Common light of LED chip is blue light. Through the composition of the fluorescent makes the blue light finally show a variety of optical properties of white light or other light.

Besides fluorescent, the nanometer particles may replace the fluorescent and the plastic shell may be done thinner. In addition, an original groove used to fill the fluorescent may also fill transparent heat dissipation material to increase heat dissipation effect. The plastic shell may be made of transparent material, which allows for a wider angle of light, less loss of light, and higher efficiency.

The first set of LED chip and the second set of LED chip have multiple LED chips. For example, an LED chip module may have three, five, ten or any other number of LED chips. The LED chips are placed on the first electrode plate or the second electrode plate in accordance with a predetermined rule and then may be connected in series with each other by a metal wire. Of course, depending on different design requirements, the LED chips may also be connected in parallel, or partially in parallel, and partially in series.

The front and ends of the LED chips connected together may be connected to the electrode plate by means of metal wires or perforations. The LED usually needs to provide a positive and negative power supply. Therefore, external power supply may be respectively connected to the two electrode plates, and further provided to the multiple LED chips connected together.

In this embodiment, the multiple LED chips are electrically connected together in series, and both ends of the multiple LED chips connected in series are connected to each of the first electrode plate and the second electrode plates. In other design requirements may also use more than two electrode plates, the following may explain several different deformation as an example of the description.

The multiple LED chips are connected in series by a metal wire such as fine gold wire or copper wire. Other lead modes may also be set as needed.

According to the experiment finds if the LED chip to maintain non-aligned between two LED chips may further increase the uniformity of light to avoid unnecessary light spots. For example, in one embodiment, at least two LED chips differ in the relative arrangement direction by an angle difference of more than 5 degrees, 10 degrees or greater. In addition to an angle, when a light source board above installation of a number of LED chip module, besides the angle, a location of the placement may also do a certain degree of random adjustment, which may further improve the effect of light show.

Even in different LED chip modules, the placement of LED chips may be different, the whole may achieve a more uniform optical effect.

In one embodiment, an area of the first electrode plate may be greater than an area of the second electrode plate and a number of LED chips in the first set of LED chip is greater than a number of the second set of LED chip. For example, the area ratio of the first electrode plate to the area of the second electrode plate is about 1.2 to 1 to 2 to 1.

In addition, in one embodiment, the first set of LED chip and the second set of LED chip are each fixed to the first electrode plate and the second electrode plate through an insulating adhesive. In other words, the LED chips are placed on a conductive electrode plate, but are not directly connected to the electrode plate.

In order to provide better heat dissipation effect, the best choice of insulation with heat dissipation effect of the adhesive, so that the heat of the LED through the electrode plate to other places for heat.

In addition, in order to achieve better heat dissipation effect, try to expand a size of the electrode plate. For example, the direction in which the first electrode plate and the second electrode plate are perpendicular to each other is an extending direction. The length of the first electrode plate and the second electrode plate in an extending direction is larger than 90% with respect to the total length of the plastic shell in the extending direction. In other words, although the plastic shell is used to fix a relative position of the first electrode plate and the second electrode plate, the size of the first electrode plate and the second electrode plate and the area exposed on the back surface of the plastic shell may be extended as much as possible.

When the back of the electrode plate with the larger plastic shell area, the plastic shell in the grasping electrode plate may increase the difficulty, resulting in structural instability. At this point, at least through the middle of the electrode plate hole in the injection molding plastic, increase the plastic shell with the electrode plate between fixed ability.

Alternatively, an enclosing portion may be provided in a portion of the four corners of the back of the plastic shell, such as two corners, three corners, or four corners to reinforce fixed force between the first electrode plate and the second electrode plate.

According to a second embodiment of the present invention provides a light apparatus. The light apparatus includes a substrate, a plurality of patterned wires provided on the substrate, a plurality of LED chip modules, and a driving circuit.

For the LED chip modules may refer above statement. Each of the LED chip module includes a first electrode plate, and a first set of LED chip is set on an upper surface of the first electrode plate. Each of the LED chip module includes a second electrode plate, and a second set of LED chip is electrically connected to the first set of LED chip. A plastic shell through which the plastic shell is formed by injection molding and fixedly connected to the first electrode plate and the second electrode plate so that the first electrode plate and the second electrode plate are spaced apart from each other by a predetermined space. The lower surface of the first electrode plate and the lower surface of the second electrode plate are respectively connected to two different polarity terminals of the power supply for driving the first set of LED chip and the second set of LED chip to emit light. Fluorescent coating covers the first set of LED chip and the second set of LED chip.

The driving circuit is connected to a part of multiple patterned wires to drive the multiple LED chip modules to emit light. The multiple patterned wires may have a flat heat sink portion which is thermally connected to the first electrode plate and the second electrode plate of multiple LED chip modules. In other words, the patterned conductor may be provided as an auxiliary pipe for heat dissipation in addition to the electrical connection. A substrate may be made of aluminum material or other substrate having good heat dissipation characteristics in order to further increase the efficiency of heat dissipation.

An insulating layer may be set between the substrate and the patterned conductor to avoid short circuits. An area of multiple flat heat dissipating portions is at least a portion corresponding to the number of the LED chips carried on the first electrode plate and the second electrode plate which are thermally connected. In other words, the area of the patterned conductor may be configured to follow the number of connected LED chips, so that the effect of heat dissipation may be achieved more evenly and efficiently.

In addition to the number of LED chips, the heat distribution on the overall light source plate may be measured and used to distribute the size of the patterned wire extension at different locations to uniformly dissipate heat.

According to another embodiment of the present invention provides a method of fabricating an LED chip module. The electrode plate is placed in the injection molding machine electrode plate by pattern etching or stamping, and the LED chip module is set on the electrode plate, and the connecting wire is arranged to connect the series or parallel of the LED chip. The fluorescent is filled as necessary to produce the desired light output.

Then, the LED chip module is placed on the light source plate to manufacture the corresponding lamp. The wires for connecting the multiple LED chip modules may be patterned according to the characteristics of the LED chip module so that the area may be dissipated in the most efficient manner with the position. In addition, it is also possible to set different LED chip modules at different positions of the same light source board to optimize the output light field effect.

DETAILED DESCRIPTION

Figure 1:
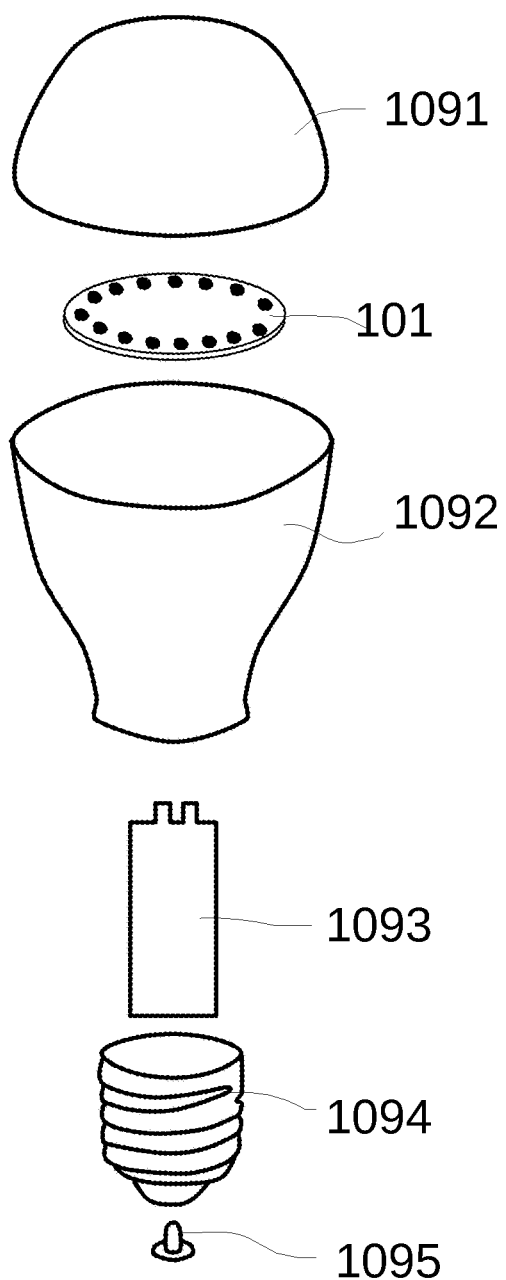
FIG. 1 illustrates an embodiment example of a light.

Please refer to FIG. 1, FIG. 1 is an embodiment example of a light. In the embodiment, the light is a light bulb and has a light transmission cover 1091, a light source board 101, a heat radiating cup 1092, a driving circuit board 1093, an Edison light cap 1094, and a light nail 1095. The light nail 1095 and the Edison light cap 1094 receive two electrical inputs from indoor power supply. Through the circuit of the driving circuit board 1093 generates a corresponding driving current for driving the LED chip on the light source board 101 to emit light.

Figure 2:
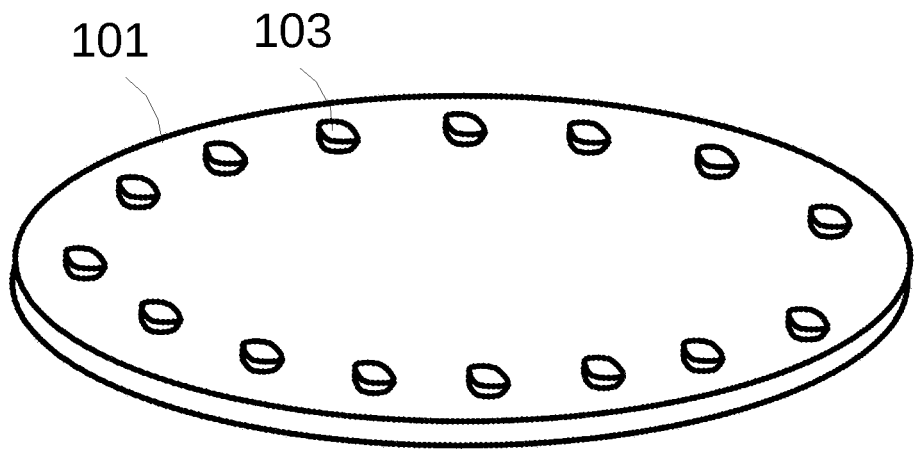
FIG. 2 illustrates an embodiment of a light source board.

Please refer to FIG. 2, FIG. 2 is an embodiment of a light source board. In the embodiment, the light source board 101 has multiple LED chip modules 103. In the example, the LED chip modules 103 are arranged in a ring shape. However, the LED chip modules 103 may also be arranged in a variety of different arrangements, or even made of light bars, folded structures to meet different design requirements at different light effect requirements.

Figure 3:
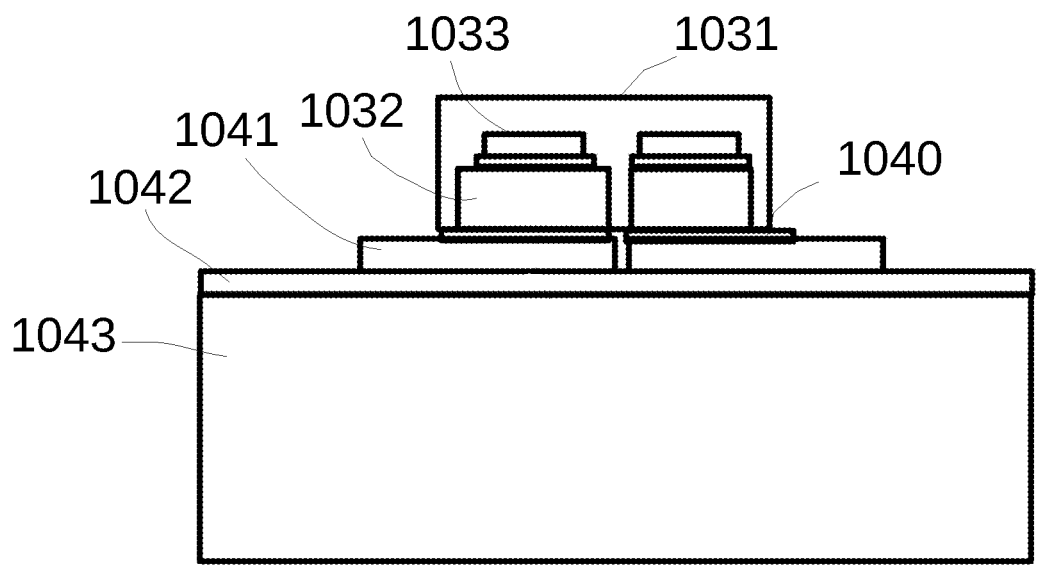
FIG. 3 illustrates a part of a profile of a light source board.

Please refer to FIG. 3, FIG. 3 is a part of a profile of a light source board. In FIG. 3, an LED chip module has a plastic shell 1031, an LED chip 1033, and an electrode plate 1032. Two or more LED chips 1033 are fixedly placed on two or more electrode plates 1032 through a suitable glue. The back surface of the electrode plate 1032 is further connected to a lead 1041 on the light source board by various welding methods such as the welding point 1040. An insulating layer 1042 is set below the lead wire 1041, and then an aluminum material substrate 1043 may be set below to achieve a better heat dissipation effect. The substrate 1043 may certainly be replaced with another material.

Figure 4:
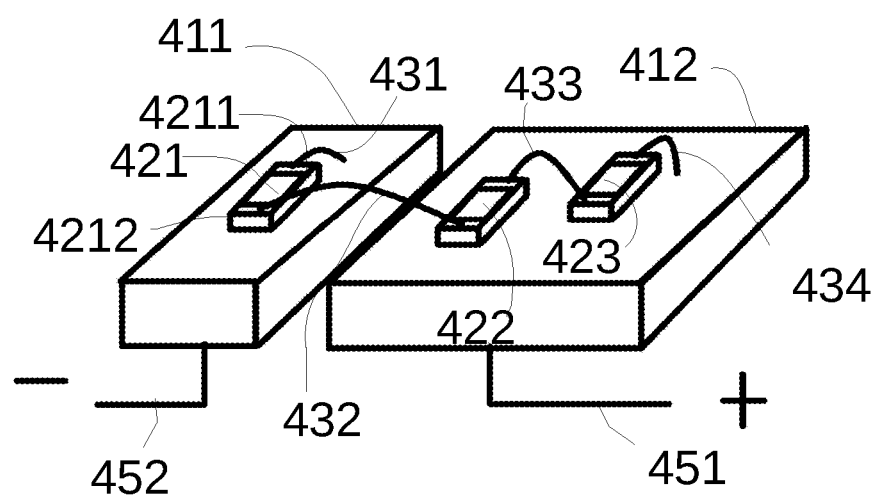
FIG. 4 illustrates a schematic representation of a portion of elements of an LED chip module.

Please refer to FIG. 4, FIG. 4 is a schematic representation of a portion of elements of an LED chip module. In the embodiment, the first set of LED chip have two LED chips 422, 423 set on the first electrode plate 412. The second set of LED chip has an LED chip 421 set on the second electrode plate 411. The LED chip 421 has two electrical connection terminals 4211, 4212. The LED chips 421, 422, 423 are connected in series through the metal wires 431, 432, 433, 434 and are respectively connected to the first electrode plate 411 and the second electrode plate 412 to a positive connection terminal 452 a negative connection terminal 451 of external power source. The external power source transmits the driving current to the LED chips 421, 422, 423 through the first electrode plate 411 and the second electrode plate 412 to generate light for illumination.

Figure 5:
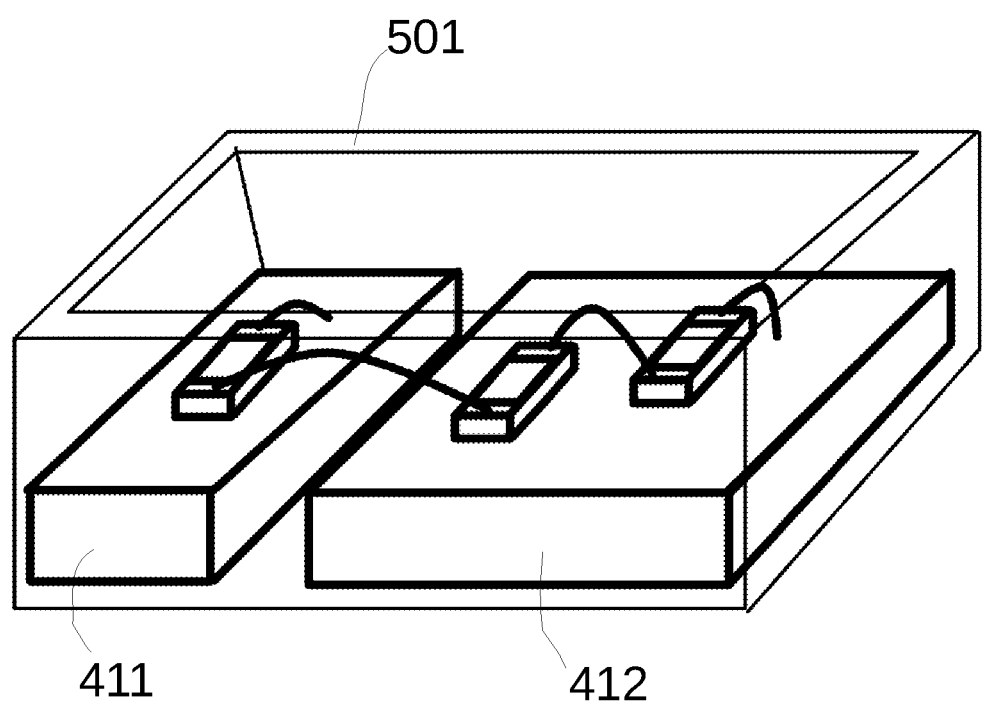
FIG. 5 illustrates a schematic representation of a portion of elements of an LED chip module.

Please refer to FIG. 5, a schematic representation of a portion of elements of an LED chip module. The electrode plates 411, 412 carrying the LED chip are fixed through the plastic shell 501 and held at a predetermined space. The plastic shell may hold the electrode plates 411, 412 by injection molding or pasting.

Figure 6:
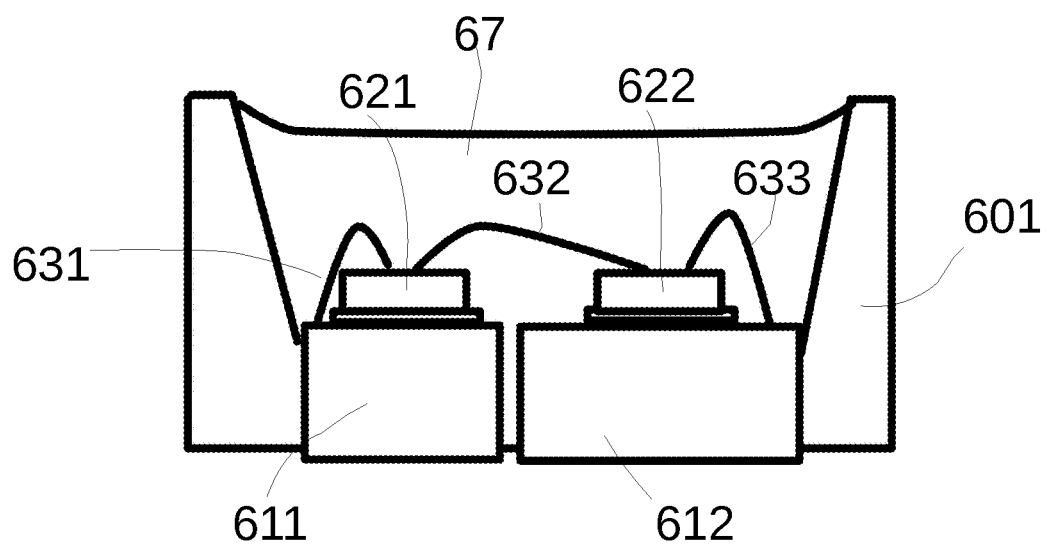
FIG. 6 illustrates a schematic cross-sectional diagram of an embodiment of an LED chip module.

Please refer to FIG. 6, a schematic cross-sectional diagram of an embodiment of an LED chip module. The LED chip module has a first electrode plate 611 and a second electrode plate 612. On the first electrode plate 612 and the second electrode plate 612, the light emitting diode chips 621, 622 are disposed. The LED chips are connected in parallel or in series with each other through a metal wire 632, and then respectively connected to an external power source through the first electrode plate 611 and the second electrode plate 612 by wires 631, 633. The plastic shell 601 holds the first electrode plate 611 and the second electrode plate 612 so as to be spaced apart and has a recessed groove 67 upwardly for filling the fluorescent so as to output illumination conforming to the desired optical characteristics.

Figure 7:
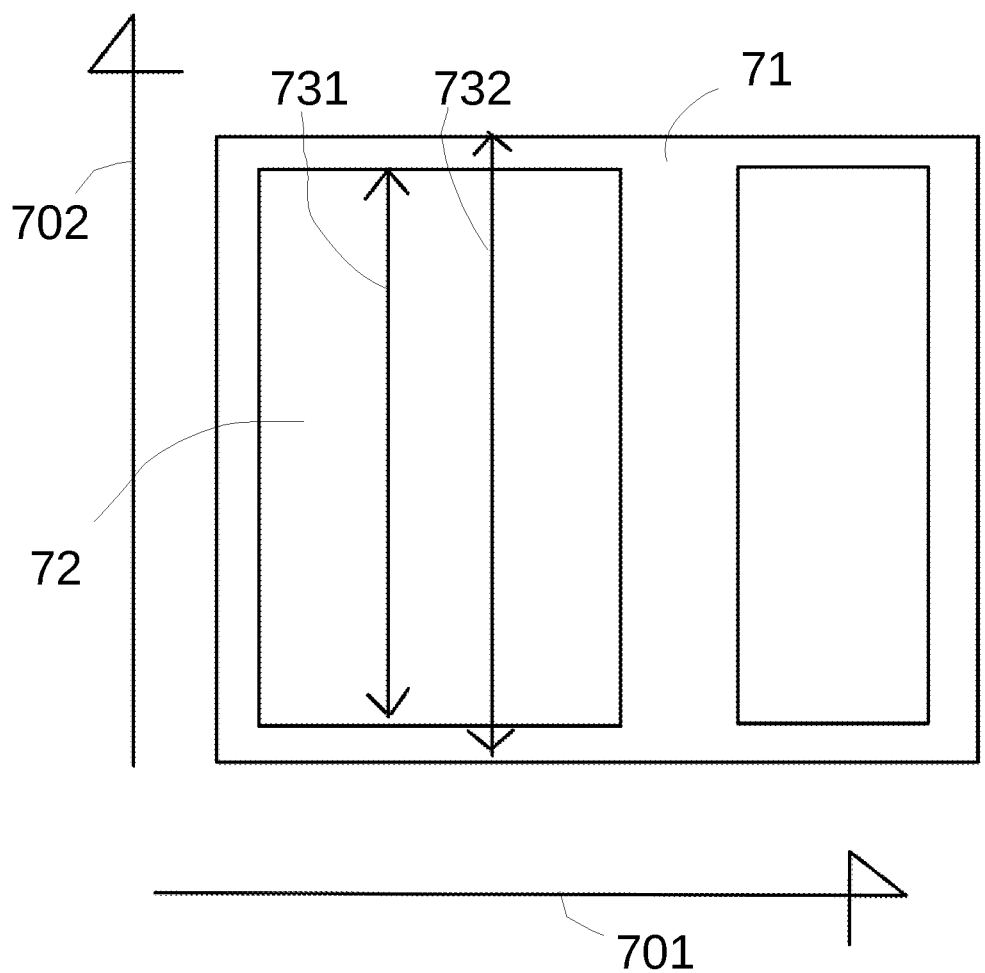
FIG. 7 illustrates a diagram of an embodiment of relationship for LED chip module rear element.

Please refer to FIG. 7, which illustrates a diagram of an embodiment of relationship for LED chip module rear element. The LED chip may produce a certain degree of heat when light. If the heat may be effectively excluded, the life of the LED chip may be a considerable help. In order to increase the heat dissipation, the area of the electrode plate 72 may be increased.

For instance, in the example, the two electrode plates face direction 701 has a vertical direction called extension direction 702. On the back side of the LED chip module, the injection shell 71 has an overall length 731 in the extension direction 702. The electrode plate 72 has a length 731 in the extending direction 702. In a better case, the length 731 of the length 732 ratio more than 90%, or even 95% may achieve a better heat dissipation effect.

Figure 8:
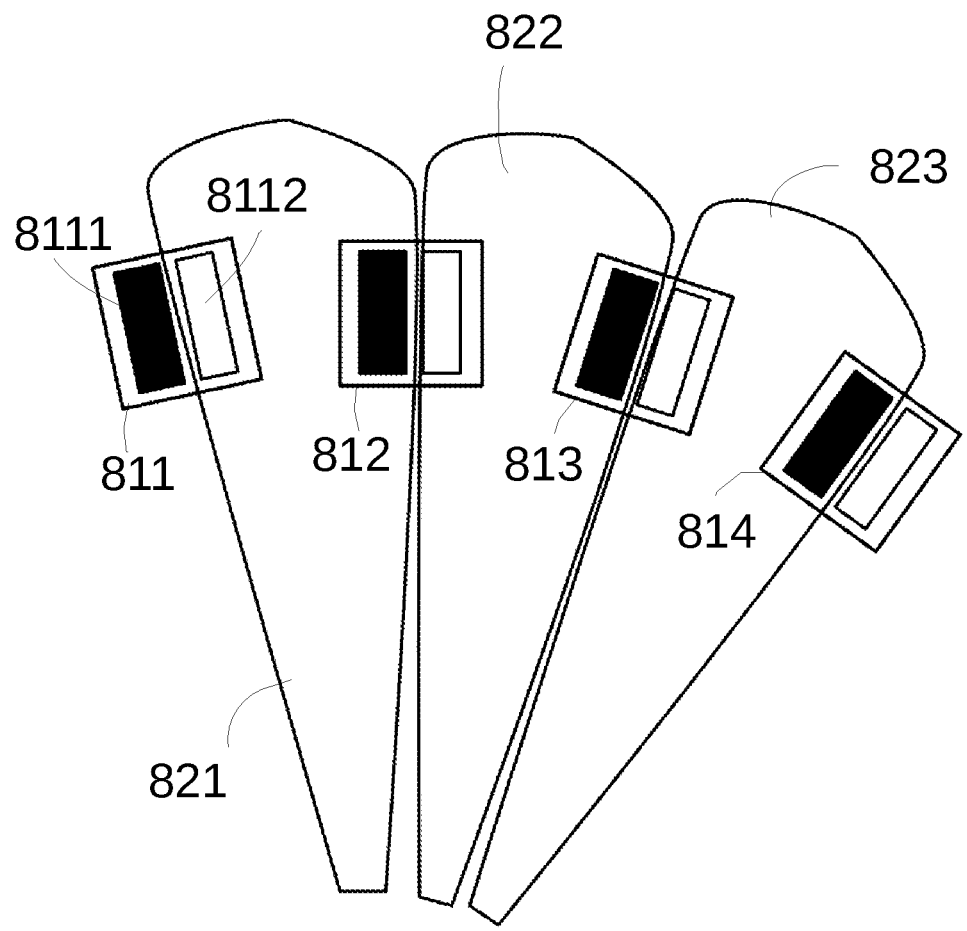
FIG. 8 illustrates a diagram of relationship between multiple LED chip modules and patterned metal wires.

Please refer to FIG. 8, FIG. 8 is a diagram of relationship between multiple LED chip modules and patterned metal wires. The LED chip modules 811, 812, 813, 814 are arranged in a ring shape. The patterned wires 821, 822, 823 are set on the substrate of the light source board to connect the LED chip modules 811, 812, 813, 814 in series or in parallel, and finally to the driving power source. For the purpose of heat dissipation, the patterned wires 821, 822, 823 may be formed in a flat pattern. In the example, the flat pattern is fan-shaped, but of course not in such a configuration as a limitation of the present invention. On the back surface of the LED chip module 811, two external electrode plates 8111 and 8112 respectively correspond to the positive electrode and the negative electrode. Through the expansion of the area increases the heat dissipation effect.

Figure 9:
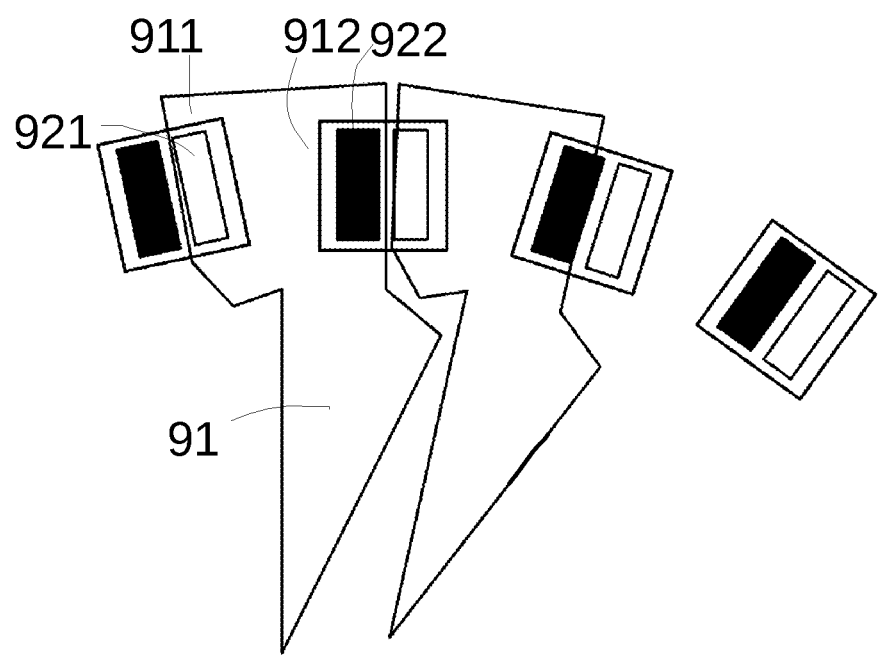
FIG. 9 illustrates another diagram of relationship between multiple LED chip modules and patterned metal wires.

Please refer to FIG. 9, FIG. 9 is another diagram of relationship between multiple LED chip modules and patterned metal wires. Similar to FIG. 8, but the patterned conductor configuration of FIG. 9 further corresponds to the number of LED chips carried by the connected electrode plate. For example, the two electrode plates 921, 922 of the adjacent LED chip modules are connected through a patterned conductor 91. The patterned conductor 91 sets the area size and the shape of the different extending regions according to the number of the LED chips on the connected electrode plates 921. For instance, in the example, the number of the LED chips on the electrode plate 921 is small, so that the first region 911 of the patterned conductor 91 closer to the electrode plate 921 has a smaller area and is close to the electrode plate having a relatively high light emitting diode chip 922 and is a relatively large area of the area 912. Through the design may further make the heat more uniform.

Figure 10:
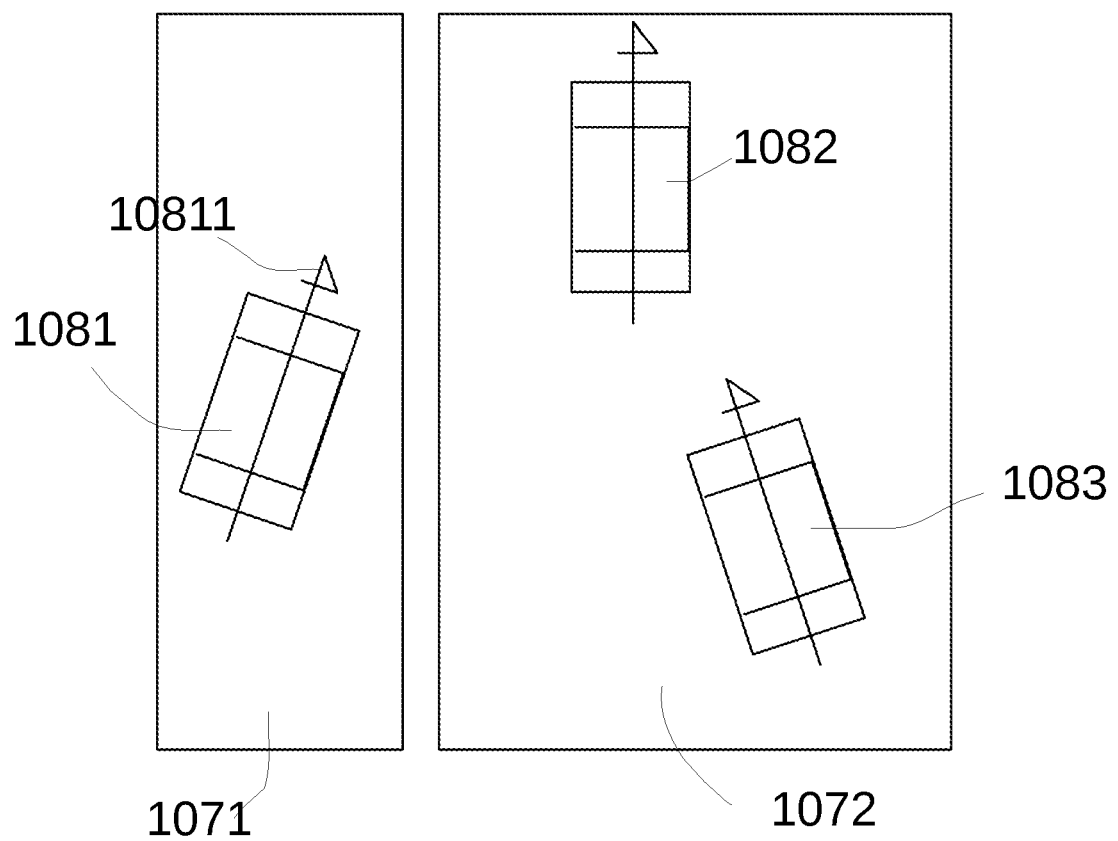
FIG. 10 illustrates an example of LED chip arrangement on an LED chip module.

Please refer to FIG. 10, FIG. 10 is an example of LED chip arrangement on an LED chip module. In the example, the electrode plate 1071 places an LED chip 1081. Two LED chips 1082, 1083 are placed on the electrode plate 1072. The LED chip 1081 has a placement direction 10811 in the electrode plate. The three LED chips 1081, 1088, and 8383 are arranged in different directions and make the light emitted more evenly to avoid unnecessary spots and other phenomena.

For example, at least two LED chips differ in the placement angle by more than 5 degrees. In some products that require higher quality, the placement angle may be set more than 10 degrees, or even set the angle with a random number.

Figure 11:
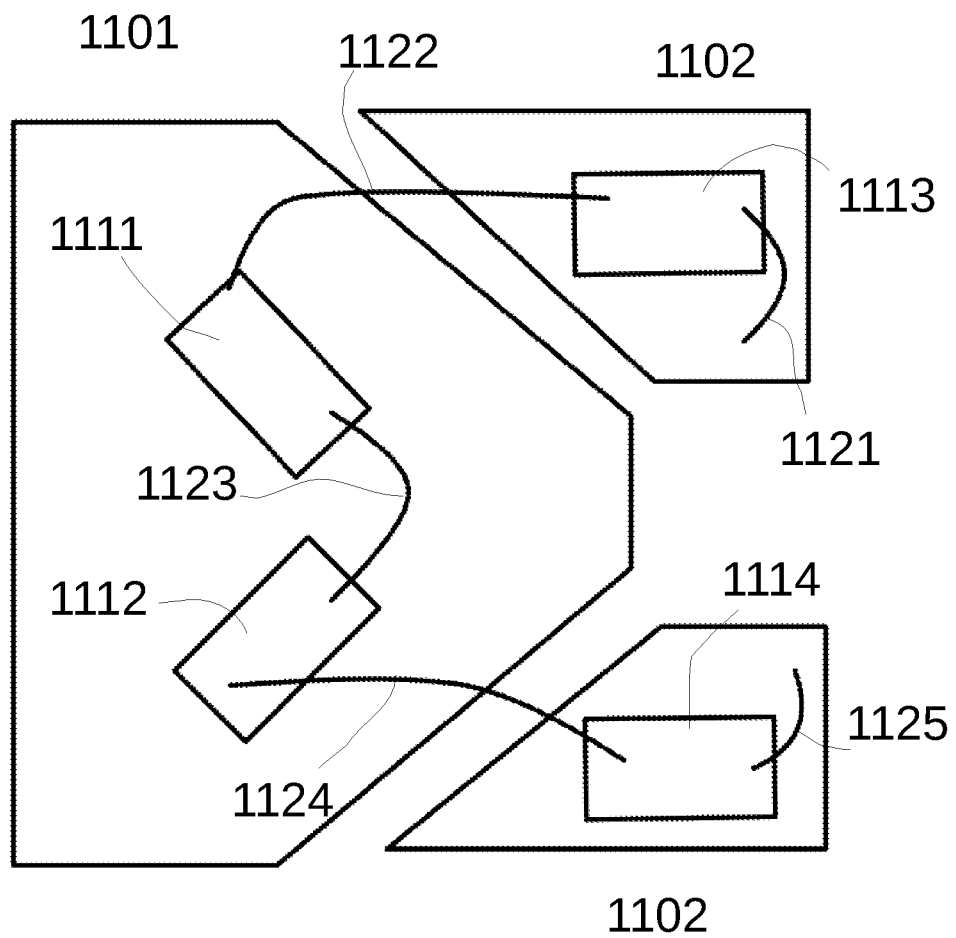
FIG. 11 illustrates another example of LED chip arrangement on an LED chip module.

Please refer to FIG. 11, FIG. 11 is another example of LED chip arrangement on an LED chip module. In the LED chip module of the embodiment, there are three non-rectangular electrode plates 1101, 1102, 1103. Multiple LED chips 1111, 1112, 1113, and 1114 are set on the electrode plates 1101, 1102. The LED chips 1111, 1112, 1113, 1114 are connected in series through wires 1122, 1123, 1124 and are connected to electrode plates 1102, 1103 through wires 1121, 1125 in order to connect an external power source.

In the embodiment, the electrode plates some of the LED chips 1111, 1112 located are not connected to an external power source, but may still function as a heat sink. In other words, some of the LED chip electrode plate is not directly connected to the external power supply, but play a heat dissipation function. The configuration in the circular light plate may have a good heat dissipation effect, and easy to design patterned wire.

Figure 12:
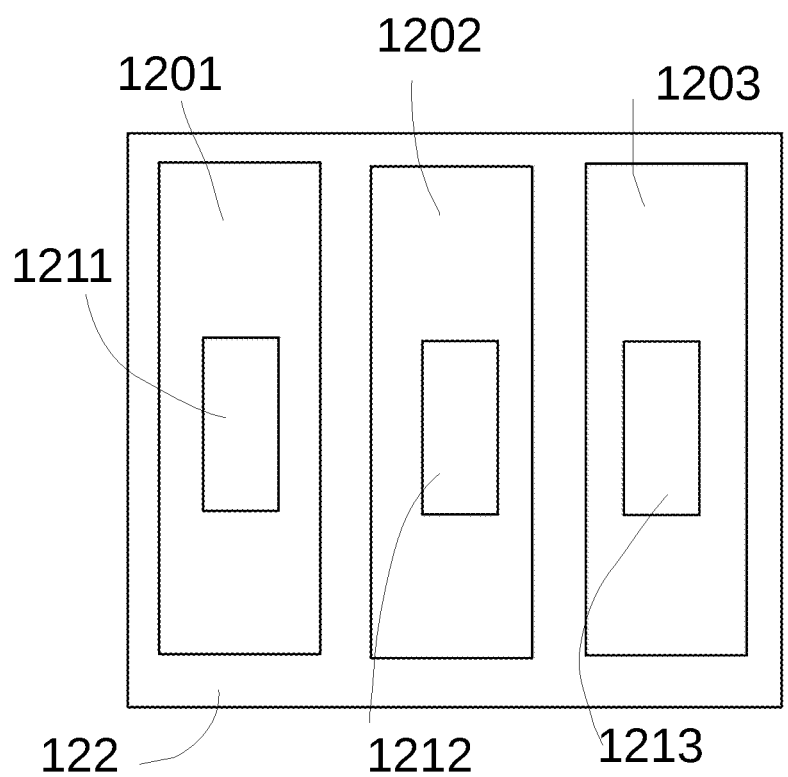
FIG. 12 illustrates another example of LED chip arrangement on an LED chip module.

Please refer to FIG. 12, FIG. 12 is another example of LED chip arrangement on an LED chip module 122. In the example are three electrode plates 1201, 1202 and 1203. The LED chips 1211, 1212, and 1213 are set on the electrode plates 1201, 1202, and 1203.

In addition to this configuration, there may be many different configurations, which may be considered to be within the scope of the present invention.

Figure 13:
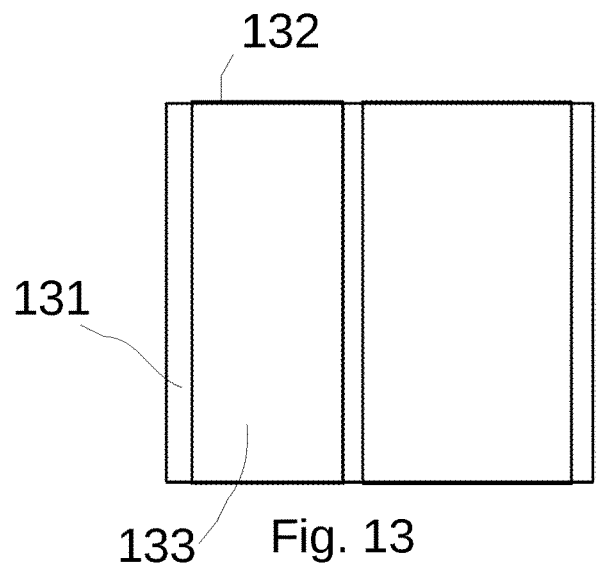
FIG. 13 illustrates a configuration diagram of a back of the LED chip module.
Figure 14:
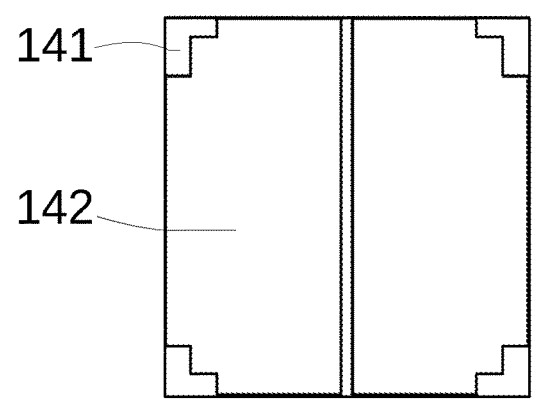
FIG. 14 illustrates another configuration diagram of a back of the LED chip module.
Figure 15:
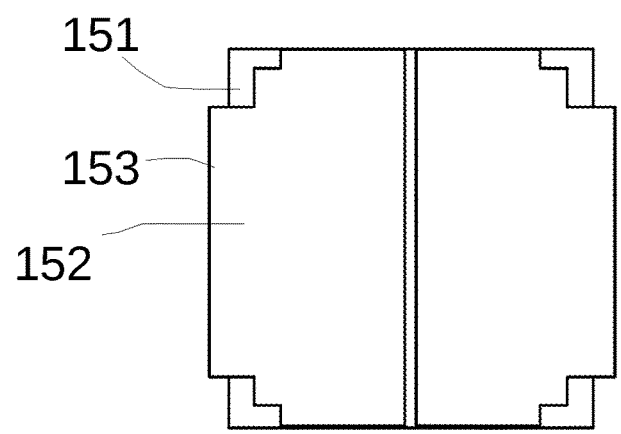
FIG. 15 illustrates another configuration diagram of a back of the LED chip module.

Please refer to FIG. 13, FIG. 14 and FIG. 15. FIG. 13 is a configuration diagram of a back of the LED chip module. FIG. 14 is another configuration diagram of a back of the LED chip module.

FIG. 15 is another configuration diagram of a back of the LED chip module.

In FIG. 13, the electrode plate 133 extends in the extending direction to the top portion 132 and achieve a better heat dissipation effect because the plastic shell in the back only part of the 131. However, such a configuration may have a stable problem. Although it is possible to treat the surface of the electrode plate by bumping or roughening the surface of the electrode plate by selecting the material to be molded or by performing some surface treatment.

In FIG. 14, the electrode plate 142 is surrounded by the peripheral corners 141 of the plastic housing, so that the stability may be further increased, and the exposed area of the electrode plate is enlarged as much as possible to increase the heat dissipation effect.

In FIG. 15, the electrode plate 152 further has a protruding portion 153, and the surrounding corners 151 may increase the heat dissipation effect.

Figure 16:
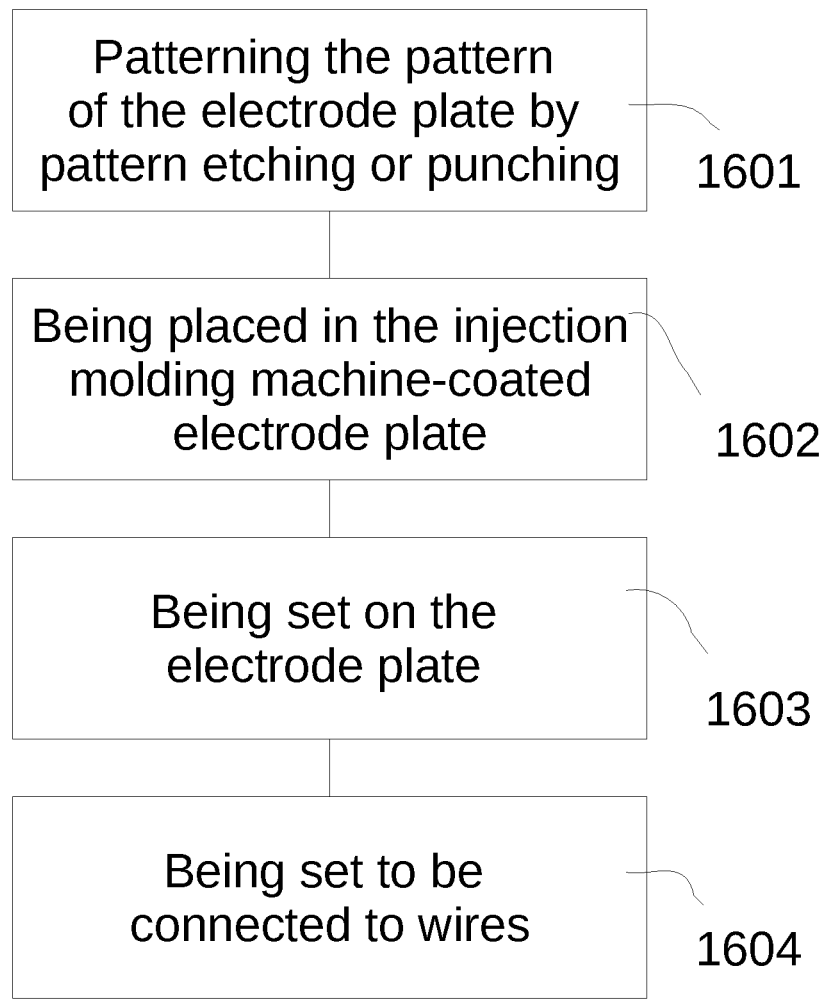
FIG. 16 illustrates another configuration diagram of a back of the LED chip module.

FIG. 16 provides a flow diagram of a method for making an LED chip module. First, patterning the pattern of the electrode plate by pattern etching or punching (step 1601), the electrode plate is placed in the injection molding machine-coated electrode plate (step 1602), the LED chip module is set on the electrode plate and set to be connected to wires (step 1604) to complete the series or parallel connection of the light emitting diode chips. The fluorescent is filled as necessary to produce the desired light output.

Then, the LED chip module is set on the light source plate to manufacture the corresponding light. The wires for connecting multiple LED chip modules may be patterned according to the characteristics of the LED chip module so that the area may be dissipated in the most efficient manner with the position. In addition, it is also possible to set different LED chip modules at different positions of the same light source board to optimize the output light field effect.

In addition to the foregoing description, the following summary illustrates various possibilities according to embodiments of the present invention.

According to a first embodiment of a present invention, the first embodiment provides an LED chip module comprising a first electrode plate and a second electrode plate. A first set of LED chip is set on the upper surface of the first electrode plate, and a second set of LED chip is set on the upper surface of the second electrode plate. The second set of LED chip is electrically connected to the first set of LED chip. The first electrode plate and the second electrode plate may be patterned with a thin copper plate and then achieve a predetermined shape of multiple first electrode plates and the second electrode plates by etching the partial regions.

The thin plate with the first electrode plate and the second electrode plate may be placed in an injection molding machine to inject the plastic shell with a predetermined mold. The plastic shell is fixedly connected to the first electrode plate and the second electrode plate by injection molding. The injection molded plastic, the first electrode plate and the second electrode plate have a fixed adhesion so that the first electrode plate and the second electrode plate keep a predetermined space between each other. The plastic shell has an opening upward, downwardly making a lower surface of the first electrode plate and a lower surface of the second electrode plate are exposed so as to be respectively connected to two different polarity terminals of the power supply. A driving current after conversion of a battery or indoor power source for driving the first set of LED chip and the second set of LED chip to emit light.

The plastic shell has a groove upward and is filled with a fluorescent coating. The fluorescent coating covers the first set of LED chip and the second set of LED chip. Common light of LED chip is blue light. Through the composition of the fluorescent makes the blue light finally show a variety of optical properties of white light or other light.

Besides fluorescent, the nanometer particles may replace the fluorescent and the plastic shell may be done thinner. In addition, an original groove used to fill the fluorescent may also fill transparent heat dissipation material to increase heat dissipation effect. The plastic shell may be made of transparent material, which allows for a wider angle of light, less loss of light, and higher efficiency.

The first set of LED chip and the second set of LED chip have multiple LED chips. For example, an LED chip module may have three, five, ten or any other number of LED chips. The LED chips are placed on the first electrode plate or the second electrode plate in accordance with a predetermined rule and then may be connected in series with each other by a metal wire. Of course, depending on different design requirements, the LED chips may also be connected in parallel, or partially in parallel, and partially in series.

The front and ends of the LED chips connected together may be connected to the electrode plate by means of metal wires or perforations. The LED usually needs to provide a positive and negative power supply. Therefore, external power supply may be respectively connected to the two electrode plates, and further provided to the multiple LED chips connected together.

In this embodiment, the multiple LED chips are electrically connected together in series, and both ends of the multiple LED chips connected in series are connected to each of the first electrode plate and the second electrode plates. In other design requirements may also use more than two electrode plates, the following may explain several different deformation as an example of the description.

The multiple LED chips are connected in series by a metal wire such as fine gold wire or copper wire. Other lead modes may also be set as needed.

According to the experiment finds if the LED chip to maintain non-aligned between two LED chips may further increase the uniformity of light to avoid unnecessary light spots. For example, in one embodiment, at least two LED chips differ in the relative arrangement direction by an angle difference of more than 5 degrees, 10 degrees or greater. In addition to an angle, when a light source board above installation of a number of LED chip module, besides the angle, a location of the placement may also do a certain degree of random adjustment, which may further improve the effect of light show.

Even in different LED chip modules, the placement of LED chips may be different, the whole may achieve a more uniform optical effect.

In one embodiment, an area of the first electrode plate may be greater than an area of the second electrode plate and a number of LED chips in the first set of LED chip is greater than a number of the second set of LED chip. For example, the area ratio of the first electrode plate to the area of the second electrode plate is about 1.2 to 1 to 2 to 1.

In addition, in one embodiment, the first set of LED chip and the second set of LED chip are each fixed to the first electrode plate and the second electrode plate through an insulating adhesive. In other words, the LED chips are placed on a conductive electrode plate, but are not directly connected to the electrode plate.

In order to provide better heat dissipation effect, the best choice of insulation with heat dissipation effect of the adhesive, so that the heat of the LED through the electrode plate to other places for heat.

In addition, in order to achieve better heat dissipation effect, try to expand a size of the electrode plate. For example, the direction in which the first electrode plate and the second electrode plate are perpendicular to each other is an extending direction. The length of the first electrode plate and the second electrode plate in an extending direction is larger than 90% with respect to the total length of the plastic shell in the extending direction. In other words, although the plastic shell is used to fix a relative position of the first electrode plate and the second electrode plate, the size of the first electrode plate and the second electrode plate and the area exposed on the back surface of the plastic shell may be extended as much as possible.

When the back of the electrode plate with the larger plastic shell area, the plastic shell in the grasping electrode plate may increase the difficulty, resulting in structural instability. At this point, at least through the middle of the electrode plate hole in the injection molding plastic, increase the plastic shell with the electrode plate between fixed ability.

Alternatively, an enclosing portion may be provided in a portion of the four corners of the back of the plastic shell, such as two corners, three corners, or four corners to reinforce fixed force between the first electrode plate and the second electrode plate.

According to a second embodiment of the present invention provides a light apparatus. The light apparatus includes a substrate, multiple patterned wires provided on the substrate, multiple LED chip modules, and a driving circuit.

For the LED chip modules may refer above statement. Each of the LED chip module includes a first electrode plate, and a first set of LED chip is set on an upper surface of the first electrode plate. Each of the LED chip module includes a second electrode plate, and a second set of LED chip is electrically connected to the first set of LED chip. A plastic shell through which the plastic shell is formed by injection molding and fixedly connected to the first electrode plate and the second electrode plate so that the first electrode plate and the second electrode plate are spaced apart from each other by a predetermined space. The lower surface of the first electrode plate and the lower surface of the second electrode plate are respectively connected to two different polarity terminals of the power supply for driving the first set of LED chip and the second set of LED chip to emit light. A fluorescent coating covers the first set of LED chip and the second set of LED chip.

The driving circuit is connected to a part of multiple patterned wires to drive the multiple LED chip modules to emit light. The multiple patterned wires may have a flat heat sink portion which is thermally connected to the first electrode plate and the second electrode plate of multiple LED chip modules. In other words, the patterned conductor may be provided as an auxiliary pipe for heat dissipation in addition to the electrical connection. A substrate may be made of aluminum material or other substrate having good heat dissipation characteristics in order to further increase the efficiency of heat dissipation.

An insulating layer may be set between the substrate and the patterned conductor to avoid short circuits. An area of multiple flat heat dissipating portions is at least a portion corresponding to the number of the LED chips carried on the first electrode plate and the second electrode plate which are thermally connected. In other words, the area of the patterned conductor may be configured to follow the number of connected LED chips, so that the effect of heat dissipation may be achieved more evenly and efficiently.

In addition to the number of LED chips, the heat distribution on the overall light source plate may be measured and used to distribute the size of the patterned wire extension at different locations to uniformly dissipate heat.

According to another embodiment of the present invention provides a method of fabricating an LED chip module. The electrode plate is placed in the injection molding machine electrode plate by pattern etching or stamping, and the LED chip module is set on the electrode plate, and the connecting wire is arranged to connect the series or parallel of the LED chip. The fluorescent is filled as necessary to produce the desired light output.

Then, the LED chip module is placed on the light source plate to manufacture the corresponding lamp. The wires for connecting the multiple LED chip modules may be patterned according to the characteristics of the LED chip module so that the area may be dissipated in the most efficient manner with the position. In addition, it is also possible to set different LED chip modules at different positions of the same light source board to optimize the output light field effect.

In addition to the above embodiments, still various modifications may be made. Within the spirit of the same invention, various designs that are familiar to the skilled in the art are intended to be included in the present invention range.

The invention claimed is:

1. An LED device, comprising:
a first electrode plate, wherein a first set of LED chips is set on an upper surface of the first electrode plate, the first set of LED chips are kept unaligned, the first electrode plate transmits heat of the first set of LED chips to a patterned conductor and receives a driving current transmitted via the patterned conductor;
a second electrode plate electrically connected to the first set of LED chip for transmitting the driving current from the first set of LED chips;
a plastic shell, wherein the plastic shell is fixedly connected to the first electrode plate and the second electrode plate by injection molding to make the first electrode plate and the second electrode plate keep a predetermined space between each other and make a lower surface of the first electrode plate and a lower surface of the second electrode plate be respectively connected to power to drive the first set of LED chip and the second set of LED chip to emit light; and
a fluorescent layer, wherein the fluorescent layer fills a groove of the plastic shell.

2. The LED chip module of claim 1, wherein a second set of LED chip is set on the upper surface of the second electrode plate, and the second set of LED chip is electrically connected to the first set of LED chip.

3. The LED chip module of claim 2, wherein the first set of LED chip and the second set of LED chip have a plurality of LED chips, the plurality of LED chips are electrically connected together in series, and two ends of the LED chip in series are each connected to the first electrode plate and the second electrode plate.

4. The LED chip module of claim 2, wherein an area of the first electrode plate is larger than an area of the second electrode plate, and a number of LED chips in the first set of LED chip is larger than a number of LED chips of the second set of LED chip.

5. The LED chip module of claim 1, wherein a direction which the first electrode plate and the second electrode plate are perpendicular to each other is an extending direction, length of the first electrode plate and the second electrode plate in an extending direction is larger than 90% with respect to the total length of a plastic shell in the extending direction.

6. A light apparatus, comprising:
a substrate;
a plurality of patterned conductors being set on the substrate; and
a plurality of LED chip modules, wherein each of the LED chip module comprises a first electrode plate, and a first set of LED chips is set on an upper surface of the first electrode plate, the first electrode plate transmits heat of the first set of LED chips to one patterned conductor and transmits a driving current of the first set of LED chips to the patterned conductor, the first set of LED chips are kept unaligned, each of the LED chip module comprises a second electrode plate electrically connected to the first set of LED chip, a plastic shell through the plastic shell is formed by injection molding and fixedly connected to the first electrode plate and the second electrode plate so that the first electrode plate and the second electrode plate are spaced apart from each other by a predetermined space, the lower surface of the first electrode plate and the lower surface of the second electrode plate are respectively connected to two different polarity terminals of the power supply for driving the first set of LED chip to emit light, and fluorescent coating covers the first set of LED chip and the second set of LED chip,
wherein the plurality of patterned conductors are thermally connected to the first electrode plate and the second electrode plate of plurality of LED chip modules.

7. The light apparatus of claim 6, further comprising a second set of LED chips placed on the second electrode plate connecting to the first set of LED chips.

8. The light apparatus of claim 7, wherein the first set of LED chip and the second set of LED chip have a plurality of LED chips, the plurality of LED chips are electrically connected together in series, and two ends of the LED chip in series are each connected to the first electrode plate and the second electrode plate.

9. The light apparatus of claim 7, wherein an area of the first electrode plate is larger than an area of the second electrode plate, and a number of LED chips in the first set of LED chip is larger than a number of LED chips of the second set of LED chip.

10. The light apparatus of claim 6, wherein the flat heat dissipation portion is the patterned wire extension portion electrically connected to the first electrode plate or the second electrode plate, and the plurality of patterns of the patterned conductors are distributed according to a distribution of heat to uniformly heat dissipation.

11. The light apparatus of claim 6, wherein a direction the first electrode plate and the second electrode plate are perpendicular to each other is an extending direction, length of the first electrode plate and the second electrode plate in an extending direction is larger than 90% with respect to the total length of a plastic shell in the extending direction.

12. The light apparatus of claim 6, wherein the plastic shell has a surrounding portion at a portion of four corners to strengthen adhesion for the first electrode plate and the second electrode plate.

* * * * *